United States Patent
Baek

(12) United States Patent (10) Patent No.: US 7,732,224 B2
Baek (45) Date of Patent: Jun. 8, 2010

(54) METAL LINE PATTERN OF SEMICONDUCTOR DEVICE AND METHOD OF FORMING THE SAME

(75) Inventor: In Cheol Baek, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 231 days.

(21) Appl. No.: 11/983,569

(22) Filed: Nov. 8, 2007

(65) Prior Publication Data
US 2008/0136031 A1  Jun. 12, 2008

(30) Foreign Application Priority Data
Dec. 7, 2006  (KR) .................. 10-2006-0123511

(51) Int. Cl.
*H01L 21/66* (2006.01)
(52) U.S. Cl. .................. 438/4; 257/E21.159
(58) Field of Classification Search .......... 438/4, 438/643; 257/E21.159
See application file for complete search history.

(56) References Cited

U.S. PATENT DOCUMENTS 5,264,712 A * 11/1993 Murata et al. .................. 257/71
2006/0276028 A1  12/2006 Park

* cited by examiner

*Primary Examiner*—W. David Coleman
*Assistant Examiner*—Daniel Shook
(74) *Attorney, Agent, or Firm*—The Law Offices of Andrew D. Fortney; Andrew D. Fortney

(57) ABSTRACT

A method of forming a metal line pattern for a semiconductor device is provided. The method includes forming a preliminary structure on a semiconductor substrate, having a lower barrier metal layer, a metal layer, and an upper barrier and/or passivation layer having a first thickness; removing a top surface of the passivation layer so that the passivation layer has a second thickness; forming a sub-passivation layer on the passivation layer; forming an adhesion promoter and a photoresist pattern on the sub-passivation layer; and forming a metal line pattern by etching the preliminary structure using the photoresist pattern as an etching mask.

18 Claims, 3 Drawing Sheets

METAL LINE PATTERN OF SEMICONDUCTOR DEVICE AND METHOD OF FORMING THE SAME

This non-provisional Application claims priority under 35 U.S.C. §119(a) to Korean Patent Application No. 0123511/2006 filed Dec. 7, 2006, the subject matter of which is hereby incorporated by reference.

BACKGROUND

The present disclosure relates to a metal line pattern of a semiconductor device and a method of forming the metal line pattern.

Generally, a semiconductor device manufactured using a silicon substrate includes an element for storing and processing data and a line pattern for inputting or outputting signals to and from the element. Aluminum and aluminum alloys are most widely used in process for manufacturing line patterns in semiconductor devices since they have excellent electric conductivity, excellent adhesive force to an oxide layer, and relatively easy processing.

In a typical metal line pattern forming method, a metal layer is formed on a substrate, and a passivation layer is formed on the metal layer to prevent the metal layer from being oxidized. A photoresist pattern is formed on the passivation layer, and the passivation layer and the metal layer are etched using the photoresist pattern as an etching mask to form the metal line pattern.

However, as design rules for the metal line pattern have been recently significantly attenuated, an alignment error of the photoresist pattern for forming the metal line pattern has frequently occurred. It is essential to accurately align the photoresist pattern on/over the metal layer.

When the photoresist pattern is misaligned, the photoresist pattern can be removed using an oxygen plasma or etchant, and a new photoresist pattern is formed on the metal layer. However, when the photoresist pattern is newly formed on the metal layer, an oxide layer may also be formed on the passivation layer. Particularly, when the passivation layer is formed of Ti or TiN, an undesirable oxide layer is formed on the passivation layer.

Hexamethyldisilazane (HMDS) may be formed on the oxide layer of the passivation layer. At this point, due to non-uniformity in the oxide layer, the HMDS is not uniformly formed on/over the passivation layer. As a result, when the photoresist pattern is re-formed on the passivation layer having the oxide layer thereon, the new photoresist pattern may collapse (or fall down sideward) before etching the metal layer. This causes the metal line pattern not to be accurately formed.

SUMMARY

In an embodiment of the present invention, a method of forming a metal line pattern of a semiconductor device includes forming a preliminary structure on a semiconductor substrate, the preliminary structure having a lower barrier metal layer, a metal layer, and an upper barrier and/or passivation layer thereon (hereinafter, the "passivation layer") having a first thickness; removing a top surface of the passivation layer so that the passivation layer has a second thickness (generally less than the first thickness; optionally forming a sub-passivation layer on the top surface-removed passivation layer; forming an adhesive force enhancing layer on the passivation or sub-passivation layer (hereinafter, the "(sub-)passivation layer"); forming a photoresist pattern on the adhesive force enhancing layer; and forming a metal line pattern structure by etching the preliminary structure using the photoresist pattern as an etching mask.

In another embodiment, a metal line of a semiconductor device includes a patterned aluminum line on a semiconductor substrate; a passivation layer including Ti and having a thickness ranging from 100 Å to 300 Å on the aluminum line, and a sub-passivation layer on the passivation layer.

Other systems, methods, features and advantages will be, or will become, apparent to one skilled in the art upon examination of the figures and the following detailed description. Nothing in this section should be taken as a limitation on those claims. Further aspects and advantages are discussed below in conjunction with the embodiments.

DETAILED DESCRIPTION OF THE EMBODIMENTS

Reference will now be made in detail to the embodiments of the present disclosure, examples of which are illustrated in the accompanying drawings.

FIGS. 1 to 5 are sectional views illustrating a method of forming a metal line pattern according to embodiments of the present invention.

Figure 1:
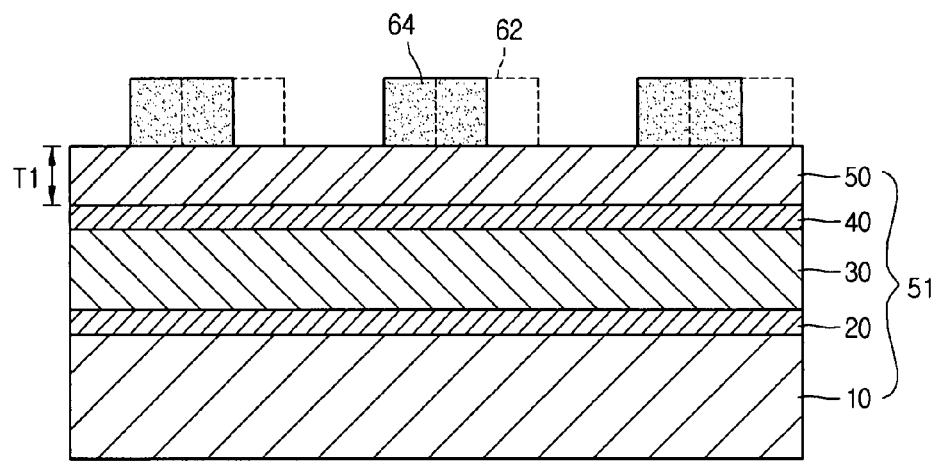
FIG. 1 is a sectional view of a preliminary metal line structure formed on a semiconductor substrate according to an embodiment of the present invention.

FIG. 1 is a sectional view of a preliminary metal line structure formed on a semiconductor substrate. Referring to FIG. 1, a lower barrier metal layer 20, a metal layer 30, an upper metal layer 40, and a passivation layer 50 are formed on a semiconductor substrate 10 to define a preliminary metal line structure. However, the upper metal layer 40 is not required in the present invention.

The lower barrier metal layer 20 may be formed, for example, by chemical vapor deposition (CVD). The lower barrier metal layer 20 may comprise Ti, TiN or a bilayer thereof (e.g., TiN on Ti). Alternatively, the lower barrier metal layer 20 may comprise or consist essentially of a material containing Ti.

The metal layer 30 may be formed, for example, by physical vapor deposition (e.g., sputtering). In various embodiments, the metal layer 30 may comprise or consist essentially of aluminum or aluminum alloy (e.g., Al with from 0.5 to 4 wt. % Cu therein; Al with 0.1 to 2 wt. % Ti and/or Si therein; etc.).

An upper metal layer 40 may be formed, for example, by CVD or PVD (e.g., sputtering). The upper metal layer 20, which can promote adhesion of passivation layer 50 to metal layer 30 and/or reduce an ohmic contact between such layers, may comprise or consist essentially of Ti, Ta or Hf.

The barrier and/or passivation layer 50 is formed on the upper metal layer 40 to protect the upper metal layer 40, the metal layer 30, and the lower barrier metal layer 20. The barrier and/or passivation layer 50 may also reduce or prevent diffusion of atoms between the metal layer 30 and an overlying oxide, and/or suppress formation of hillocks in metal layer 30. In this embodiment, the passivation layer 50 has a thickness T1 and may comprise or consist essentially of a metal nitride such as TiN, WN, MoN, TaN, HfN, etc., or a metal alloy such as TiW (e.g., containing Ti and W in an atomic ratio of about 30:70).

In order to form a metal line pattern by patterning the passivation layer 50, the upper metal layer 40, the metal layer 30, and the lower barrier metal layer 20, an adhesive force enhancing layer (not shown) is formed on the passivation layer 50. The adhesive force enhancing layer may comprise or consist essentially of, for example, HMDS.

A photoresist film (not shown) is formed on the adhesive force enhancing layer. The photoresist film may be formed, for example, by spin coating.

After forming the photoresist film, the photoresist film is patterned by photolithography, including exposing (e.g., irradiating through a photomask) and developing processes, thereby forming a photoresist pattern 64 on the adhesive force enhancing layer.

However, as the design rule between metal lines shrinks, a gap between lines of the photoresist pattern 64 may vary, and thus the photoresist pattern 64 may be misaligned from a desired location. FIG. 1 shows a target location 62 for the photoresist pattern.

When the photoresist pattern 64 is misaligned, the photoresist pattern 64 is removed from the passivation layer 50 and a new photoresist pattern 64 is formed on the passivation layer 50. At this point, the misaligned photoresist pattern 64 may be removed by wet etching or dry etching (e.g., using an oxygen-containing plasma).

Figure 2:
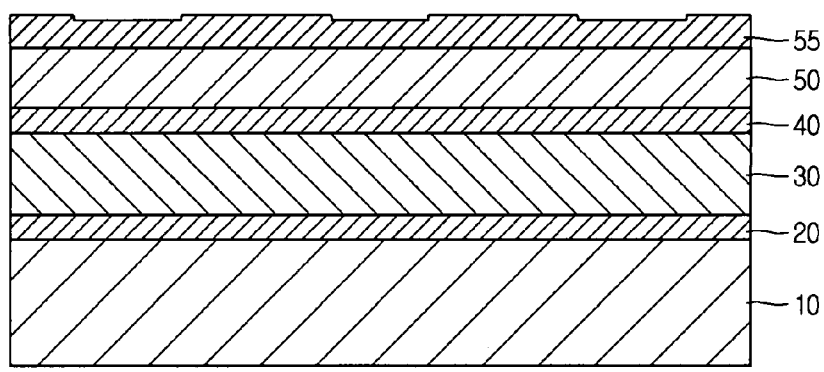
FIG. 2 is a sectional view of an oxide layer formed on a passivation layer according to an embodiment of the present invention.

FIG. 2 is a sectional view of an oxide layer 55 on the passivation layer 50.

Referring to FIG. 2, when the photoresist pattern 64 is removed by the etchant or oxygen plasma, an oxide layer 55 is formed on the passivation layer 50. For example, the oxide layer 55 may include oxidized titanium nitride (e.g., it may be or include a TiON layer). Since the misaligned photoresist pattern 64 may protect some parts of the passivation layer 50 from being oxidized immediately upon exposure to the wet etchant (which may include an oxidant such as hydrogen peroxide, ozone, nitric acid, sulfuric acid, etc.) or the oxygen-containing plasma (e.g., which may contain an oxygen radical source such as dioxygen and/or ozone), the surface of the oxide layer 55 may be uneven.

Figure 3:
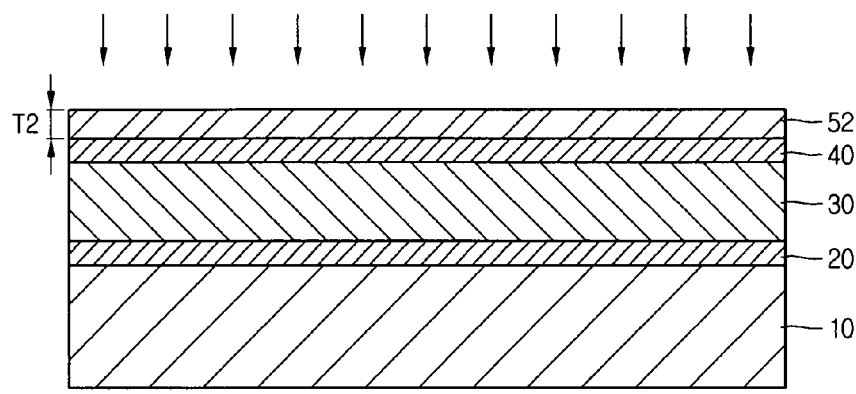
FIG. 3 is a sectional view illustrating removal of the oxide layer of FIG. 2.

FIG. 3 is a sectional view illustrating a process for removing the oxide layer 55 of FIG. 2.

Referring to FIG. 3, the oxide layer 55 is blanket-etched by a dry or wet etching process. When the oxide layer 55 is not removed, the adhesive force enhancing layer (e.g., HMDS) may not be uniformly deposited on the oxide layer 55, and thus, the new photoresist pattern formed on the oxide layer 55 may not adhere well (and possibly fall down sideward). Therefore, in this embodiment, the oxide layer 55 is removed.

After removing the oxide layer 55, the passivation layer 50 is generally also partly removed with the oxide layer 55 in order to prevent the oxide layer 55 from remaining on the passivation layer 50. Therefore, a thickness T2 of the passivation layer 50 as depicted in FIG. 2 is less than the thickness T1 of the passivation layer 50 as depicted in FIG. 1. In this embodiment, the thickness T2 of the passivation layer 50 may range from 100 Å to 300 Å.

However, when the thickness of the passivation layer 52 is reduced as described above, the passivation layer 52 may lose one or more of its functions. In this case, the layers under the passivation layer 52 may be damaged or scratched (e.g., by external impact). However, in another embodiment, the passivation layer 52 may have a sufficient thickness (e.g., greater than 300 Å, preferably at least 400 Å) to provide a desired level of functionality (e.g., to prevent diffusion of atoms from an adjacent layer, to prevent hillocks, to reduce reflections [e.g., provide an antireflective function], etc.). In this case, the adhesion promoting or enhancing layer (e.g., HMDS or other photoresist adhesion promoter) can be deposited directly on the relatively thin passivation layer 52.

Figure 4:
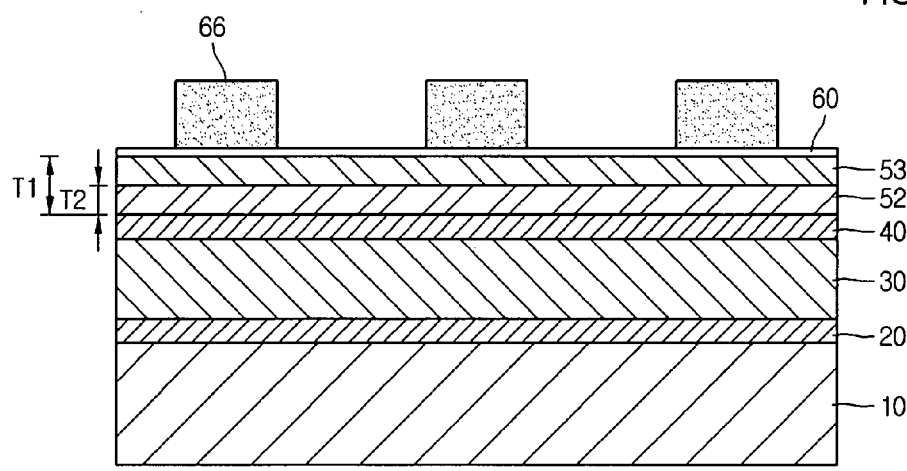
FIG. 4 is a sectional view of a sub-passivation layer formed on the passivation layer of FIG. 3.

FIG. 4 is a sectional view of a sub-passivation layer 53 formed on the passivation layer 52 of FIG. 3.

Referring to FIG. 4, in order to enhance the function of the passivation layer 52 that may have a loss of function due to the reduction of the thickness thereof, a sub-passivation layer 53 is formed on the passivation layer 52. In this embodiment, a material of the sub-passivation layer 53 may be identical to that of the passivation layer 52. Alternatively, a material of the sub-passivation layer 53 may be different from that of the passivation layer 52. In this embodiment, the sub-passivation layer 53 may include TiN, TaN, HfN, TiW or other material mentioned herein as a passivation and/or barrier layer.

In this embodiment, a sum of the thicknesses of the sub-passivation layer 53 and the passivation layer 52 may be substantially identical to the thickness T1 of the passivation layer 50 depicted in FIG. 1. Alternatively, the thickness T1 of the passivation layer 50 may be relatively high (e.g., from more than 500 Å to about 900 Å, preferably from about 600 Å to about 850 Å) so that removing the oxide layer 55 results in a relatively thin passivation layer 52 that has a target thickness for the passivation layer.

After forming the sub-passivation layer 53, the adhesive force enhancing layer (or adhesion promoter) 60 is formed on an entire surface of the sub-passivation layer 53. The adhesive force enhancing layer 60 may comprise or consist essentially of HMDS. The adhesive force enhancing layer 60 is very uniformly formed on the sub-passivation layer 53. After the above, a photoresist film is formed on an entire surface of the adhesive force enhancing layer 60 and patterned to form a photoresist pattern 66.

Figure 5:
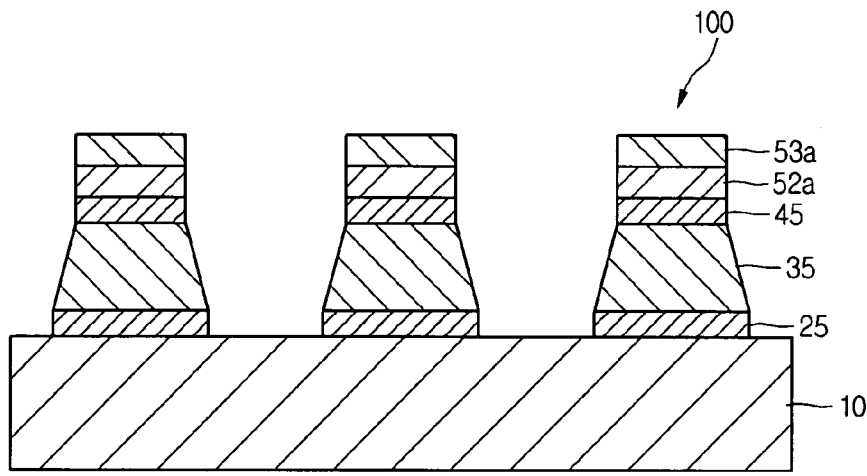
FIG. 5 is a sectional view of a metal line structure formed by patterning the preliminary metal line structure of FIG. 4.

FIG. 5 is a sectional view of a metal line structure formed by patterning the preliminary structure of FIG. 4.

Referring to FIG. 5, the preliminary structure for metal lines (or a metallization layer) depicted in FIG. 1 is patterned using the photoresist pattern 66 depicted in FIG. 4 as an etching mask to form the metal line pattern structure including the lower barrier metal pattern 25, the metal pattern 35, the upper barrier metal pattern 45, the passivation layer pattern 52a, and the sub-passivation pattern 53a. After forming the metal line pattern, the photoresist pattern 66 is removed, in the course of which the adhesive force enhancing layer 60 may be removed.

Figure 6:
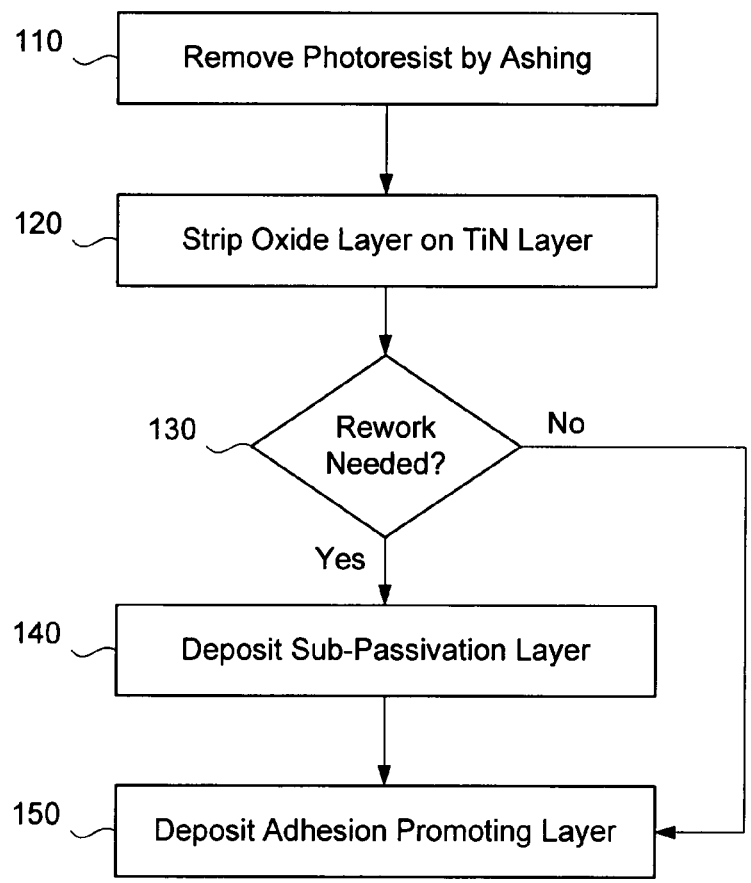
FIG. 6 is a flow chart of an exemplary process for making a metal line structure in accordance with the present invention.

FIG. 6 is a flow chart of an exemplary process for making a metal line structure in accordance with the present invention. In step 110, a photoresist pattern (which may be misaligned or which may have collapsed or fallen over in part) is removed, by ashing or wet etching as described herein. Then, any oxide that may have formed on the surface of a passivation layer (e.g., TiN) is removed in step 120, as described herein. If the passivation layer needs rework (e.g., it is not sufficiently thick to provide one or more desired functions; see decision block 130), then a sub-passivation layer is added in step 140, and the adhesion promoting layer (e.g., HMDS) is deposited on the sub-passivation layer in step 150. If the passivation layer is sufficiently thick for further processing, then rework may not be needed (see decision block 130), and the adhesion promoting layer (e.g., HMDS) can be deposited directly on the oxide-removed passivation layer in step 150.

According to the present invention, since the passivation layer that is damaged during the reworking process of the photoresist pattern is subsequently enhanced by forming a sub-passivation layer thereon, an excellent (and more aligned) metal line pattern structure can be formed.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive. The above disclosed subject matter is to be considered illustrative, and not restrictive, and the appended claims are intended to cover all such modifications, enhancements, and other embodiments, which fall within the true spirit and scope of the present invention.

What is claimed is:

1. A method of forming a metal line pattern, comprising:
   forming a preliminary structure on a semiconductor substrate, the preliminary structure having a lower barrier metal layer, a metal layer, and an upper barrier and/or passivation layer having a first thickness;
   removing a top surface of the upper barrier and/or passivation layer so that the upper barrier and/or passivation layer has a second thickness;
   forming a sub-passivation layer on the upper barrier and/or passivation layer having the second thickness;
   forming an adhesive force enhancing layer on the sub-passivation layer;
   forming a photoresist pattern on the adhesive force enhancing layer; and
   forming a metal line pattern by etching the preliminary structure using the photoresist pattern as an etching mask.

2. The method according to claim 1, further comprising, before removing the top surface of the upper barrier and/or passivation layer, forming an oxide layer on the passivation layer.

3. The method according to claim 1, further comprising, before removing the top surface of the upper barrier and/or passivation layer, removing a preliminary photoresist pattern formed on the preliminary structure.

4. The method of claim 1, wherein the sub-passivation layer has a thickness corresponding to a difference between the first and second thicknesses.

5. The method according to claim 1, wherein the adhesive force enhancing layer includes hexamethyldisilazane.

6. The method according to claim 1, wherein each of the lower barrier metal layer and the upper barrier and/or passivation layer includes Ti or TiN.

7. The method according to claim 1, wherein the second thickness ranges from 100 Å to 300 Å.

8. The method according to claim 1, further comprising, after forming the metal line pattern, removing the photoresist pattern and the adhesive force enhancing layer.

9. The method according to claim 1, wherein the upper barrier and/or passivation layer includes an upper barrier layer and a passivation layer.

10. The method according to claim 2, wherein the oxide layer is formed by removing a misaligned photoresist pattern on the preliminary structure.

11. The method according to claim 2, wherein the oxide layer comprises TiON.

12. The method according to claim 2, wherein a thickness of the oxide layer ranges from 50 Å to 150 Å.

13. The method according to claim 9, wherein the upper barrier metal layer includes Ti, Ta or Hf.

14. The method according to claim 9, wherein the upper barrier metal layer includes Ti.

15. The method according to claim 9, wherein the passivation layer includes TiN, TaN, HfN, WN, MoN or TiW.

16. The method according to claim 10, wherein the photoresist pattern is removed using an oxygen-containing plasma or etchant.

17. The method according to claim 14, wherein the passivation layer includes TiN.

18. The method according to claim 15, wherein the passivation layer includes TiN.

\* \* \* \* \*